(12) United States Patent
Veloso

(10) Patent No.: US 7,709,380 B2
(45) Date of Patent: May 4, 2010

(54) METHOD FOR GATE ELECTRODE HEIGHT CONTROL

(75) Inventor: Anabela Veloso, Leuven (BE)

(73) Assignee: IMEC, Leuven (BE)

( * ) Notice: Subject to any disclaimer, the term of this patent is extended or adjusted under 35 U.S.C. 154(b) by 377 days.

(21) Appl. No.: 11/645,148

(22) Filed: Dec. 22, 2006

(65) Prior Publication Data

US 2007/0148886 A1 Jun. 28, 2007

(30) Foreign Application Priority Data

Dec. 23, 2005 (EP) .................................. 05447291

(51) Int. Cl.
*H01L 21/44* (2006.01)
(52) U.S. Cl. ............... 438/664; 438/633; 257/E21.682; 257/E21.624; 257/E21.692
(58) Field of Classification Search ................. 438/664, 438/667, 633; 257/E21.624, E21.636, E21.635, 257/E21.621, E21.622
See application file for complete search history.

(56) References Cited

U.S. PATENT DOCUMENTS

| 5,731,239 | A | 3/1998 | Wong et al. | |
|---|---|---|---|---|
| 6,124,189 | A | 9/2000 | Watanabe et al. | |
| 6,200,866 | B1 | 3/2001 | Ma et al. | |
| 6,787,425 | B1 * | 9/2004 | Rotondaro et al. | 438/300 |
| 2005/0026379 | A1 * | 2/2005 | Kammler et al. | 438/303 |
| 2005/0056881 | A1 | 3/2005 | Yeo et al. | |
| 2007/0057331 | A1 * | 3/2007 | Satou et al. | 257/384 |
| 2008/0093682 | A1 * | 4/2008 | Yao et al. | 257/413 |

OTHER PUBLICATIONS

Anil et al., "CMP-less integration of Fully Ni-Silicided Metal Gates in FinFETs by simultaneous silicidation of the source, drain, and the gate using a novel dual hard mask approach," 2005 Symposium on VLSI Technology Digest of Technical Papers, pp. 198-199.
Anil et al., "Demonstration of Fully Ni-Silicided Metal Gates on $HfO_2$ based high-k gate dielectrics as a candidate for low power applications," 2004 Symposium on VLSI Technology Digest of Technical Papers, pp. 190-191.

(Continued)

*Primary Examiner*—Caridad M Everhart
(74) *Attorney, Agent, or Firm*—Knobbe Martens Olson & Bear LLP

(57) ABSTRACT

One inventive aspect relates to a method of controlling the gate electrode in a silicidation process. The method comprises applying a sacrificial cap layer on top of each of at least one gate electrode, each of the at least one gate electrode deposited with a given height on a semiconductor substrate. The method further comprises applying an additional layer of oxide on top of the sacrificial layer. The method further comprises covering with a material the semiconductor substrate provided with the at least one gate electrode having the sacrificial cap layer with the additional oxide layer on top. The method further comprises performing a CMP planarization step. The method further comprises removing at least the material and the additional layer of oxide until on top of each of the at least one gate electrode the sacrificial cap layer is exposed. The method further comprises removing the sacrificial cap layer from each of the at least one gate electrode, yielding each of the at least one gate electrode still having the given height.

20 Claims, 3 Drawing Sheets

OTHER PUBLICATIONS

Van Dal et al., "Demonstration of Short-Channel Self-Aligned Pt$_2$Si-FUSI pMOSFETs With Low Threshold Voltage (−0.29 V) on SiON and HfSiON," IEEE Electron Device Letters, vol. 27, No. 8, Aug. 2006, pp. 665-667.

* cited by examiner

Figure 1: prior art

METHOD FOR GATE ELECTRODE HEIGHT CONTROL

BACKGROUND OF THE INVENTION

1. Field of the Invention

The present invention relates to the field of the fabrication of silicided gate devices by means of a CMP integration scheme.

2. Description of the Related Technology

CMP is a method of removing layers of solid by chemical-mechanical polishing carried out for the purpose of surface planarization. In a chemical-mechanical polishing (CMP) scheme after the planarization step, the material (e.g. oxide) covering the wafer is thinner on top of smaller structures ($t_2$) than on top of larger structures ($t_1$), as illustrated in FIG. 1. This is a characteristic feature of a CMP process. This CMP non-uniformity within-die and also within-wafer has an impact on the dry etch process that clears the oxide from the top of the poly-Si gates, while leaving the source/drain (S/D) areas covered by oxide. Indeed, to guarantee that oxide on top of all gate electrodes (small and large) is removed (which constitutes an essential condition to (fully) silicide the gates later on), an over-etch time has to be applied. The higher the non-uniformity values, the longer the over-etch time needs to be. This puts stricter constraints on the dry etch process, since a very high etch rate selectivity of the gate electrode material (e.g. poly-Si) vs. that of the material (e.g. oxide) covering the devices is then required. If, for example, there is still an oxide layer of a certain thickness on top of some gate electrodes, while some other devices are already oxide cleared out, then the dry etch selectivity towards the gate electrode should be very high to ensure that all gate electrodes end up with the same final height.

FIG. 1 schematically represents the process flow showing the CMP non-uniformity problem encountered in the prior art. On a semiconductor substrate (10), shallow trench isolation (STI) regions (11) are defined, followed by gate stack patterning. Gate structures with different lengths were defined as shown in FIG. 1a: (I) small gate; (II) large gate. The conventional gate stack consists of a thin gate dielectric layer (12), a gate electrode (13) and an additional layer (14). After gate patterning, spacers (15) definition and silicidation of the source and drain regions (16), a material (17) is deposited in order to planarize the structures prior to the chemical-mechanical-polishing (CMP). After the CMP, the non-uniformity of the remaining material is illustrated by the different values of the thickness on top of the large gates (t1) and the small gates (t2), with t1>t2 as shown in FIG. 1a. FIG. 1b shows schematically the exposed gate electrode on the small gate (I) after the oxide etch-back step. During the over-etch step need to clear out the material (17) and the additional layer (14) from the larger gate structures, the gate electrode (13) from the small gates (I) is partially consumed, whereas on the large gates (II) the initial $t_{electrode}$ thickness is still present as illustrated in FIG. 1c.

The CMP non-uniformity could possibly be improved with the use of a liner (stop CMP liner). The problem with implementing this alternative approach is in the choice of the material(s) to use as liner, such that the spacers integrity is not compromised and the process complexity is not increased (as if a liner with multiple layers were chosen). A nitride stop CMP liner as disclosed by Wong et al. in U.S. Pat. No. 5,731,239 does not completely solve the non-uniformity problem after CMP and limits the choice of spacer material to oxide. In this case, if nitride spacers were used, their integrity would be affected by the liner removal step.

It is thus desirable to provide a method for controlling the height of gate electrodes in a silicidation process.

SUMMARY OF CERTAIN INVENTIVE ASPECTS

One inventive aspect relates to a method for controlling the gate electrode height in a silicidation process. The method comprises:
  applying a sacrificial cap layer on top of each of at least one gate electrode, each of the at least one gate electrode deposited with a given height on a semiconductor substrate,
  applying an additional layer of oxide on top of the sacrificial layer,
  covering with a material the semiconductor substrate provided with the at least one gate electrode having the sacrificial cap layer with the additional layer of oxide on top,
  performing a chemical-mechanical polishing (CMP) planarization step,
  removing at least the material and the additional layer of oxide until on top of each of the at least one gate electrode the sacrificial cap layer is exposed,
  removing the sacrificial cap layer from each of the at least one gate electrode, yielding each of the at least one gate electrode still having the given height.

Advantageously the method further comprises a step of patterning the sacrificial cap layer and of encapsulating with spacers the gate electrode, provided with the sacrificial cap layer on top and, optionally, with the additional layer of oxide.

Preferably the method further comprises a step of siliciding the at least one gate electrode still having the given height.

In another preferred embodiment the at least one gate electrode is in poly-Silicon or in amorphous silicon. The sacrificial cap layer preferably is in SiGe. Alternatively, it may be in any material with a slower etch rate than the material used to cover the semiconductor substrate. Advantageously, the sacrificial cap layer is removed with a wet etch.

The material for covering the semiconductor substrate is advantageously oxide or phosphosilicate glass.

DETAILED DESCRIPTION OF CERTAIN ILLUSTRATIVE EMBODIMENTS

Figure 1:
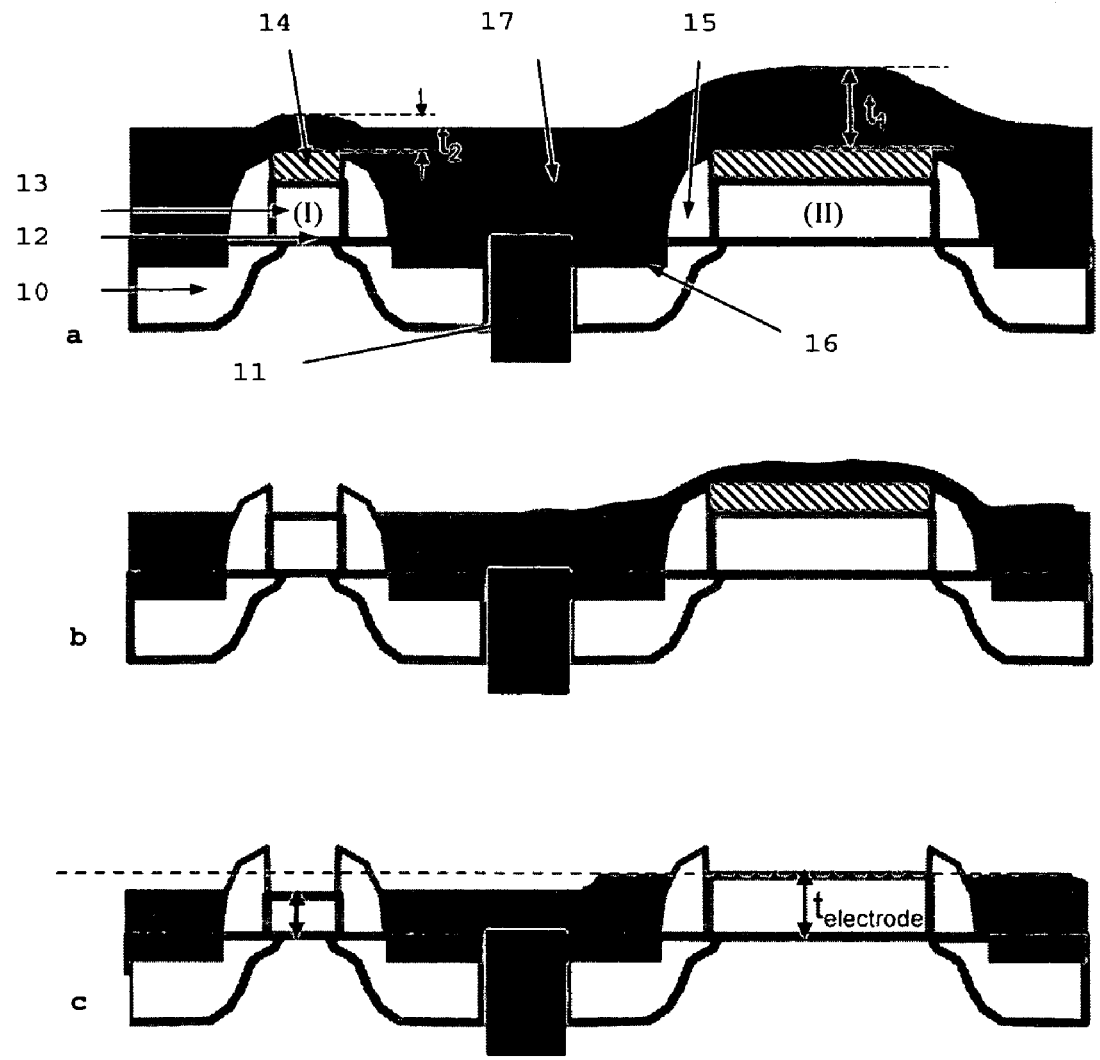
FIG. 1 represents the CMP non-uniformity problem encountered in the prior-art: (a) after CMP; (b) after oxide etch back until the exposure of the gate electrode on the small gates; (c) after further oxide etch back (over-etch) until the exposure of the gate electrode on the large gates.
Figure 2:
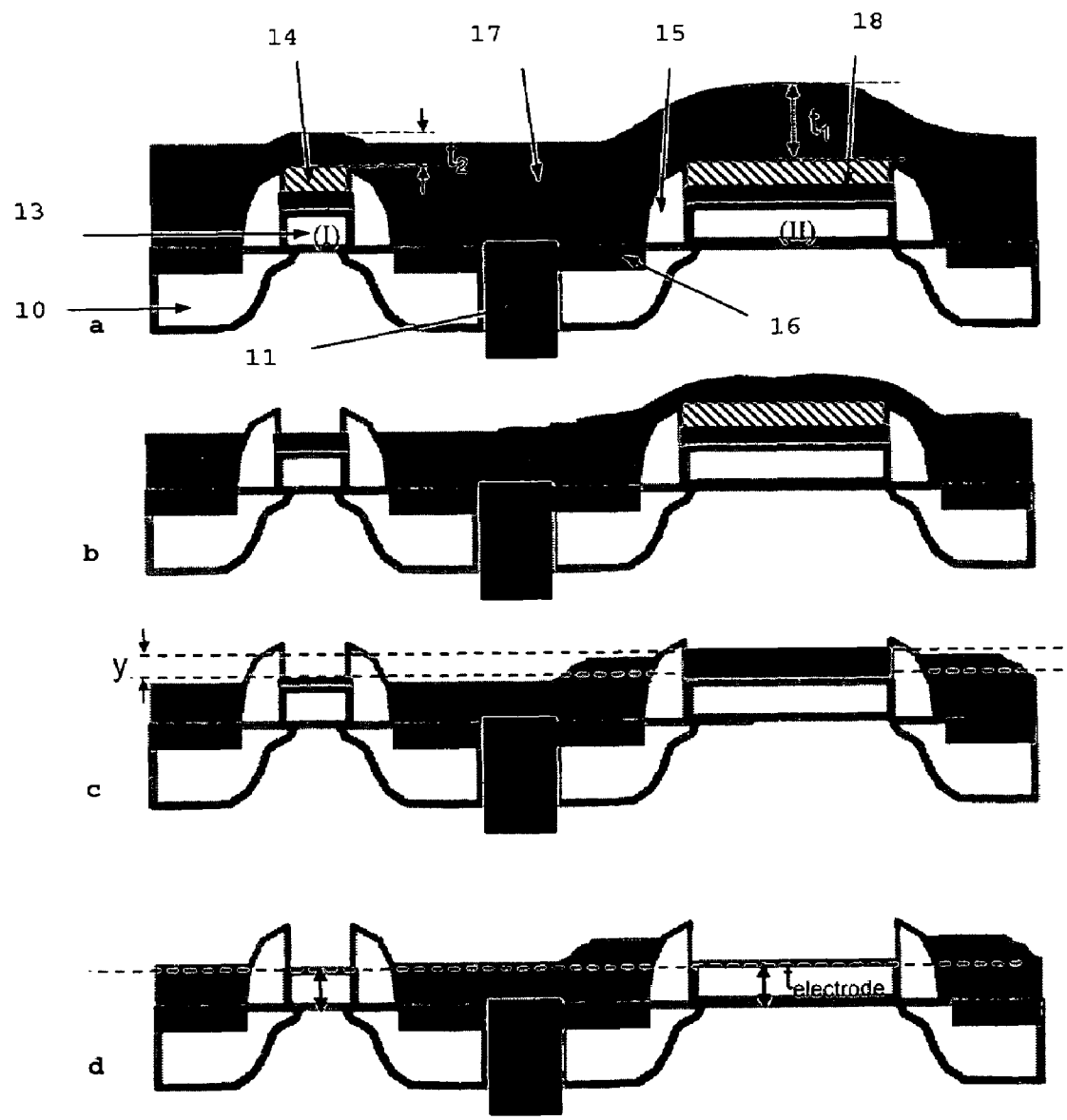
FIG. 2 represents the steps of the method according to one embodiment: (a) after CMP; (b) after oxide etch back until the exposure of the sacrificial layer on the small gates; (c) after further oxide etch back (over-etch) until the exposure of the sacrificial layer on the large structures; (d) after selective removal of the sacrificial layer.

FIG. 2 schematically shows the steps of the method according to one embodiment. In the embodiment a sacrificial cap layer (18) (e.g. in SiGe) is used on top of the gate electrode (13) (e.g. poly-silicon), (possibly) encapsulated by the spacers (15). The sacrificial layer (18) has an initial thickness $t_{SiGe}$ and can be removed with high selectivity (e.g. by wet etch) with respect to the gate electrode (13), the spacers (15) and the oxide covering the S/D silicide (17).

FIG. 2a illustrates the within-wafer and within-die non-uniformity of the material (17) after CMP. The remaining thickness of the material on top of the small gates (t2) is typically lower than the thickness of the remaining material on top of the large gates (t1), with t1>t2.

By performing an oxide etch back, both the remaining material (17) and the additional layer (14) are removed until the sacrificial layer (18) on the small gates is exposed as illustrated in FIG. 2b. End point detection is used to detect the exposure of the sacrificial layer (18) on the small gates (I).

Next, an overetch step is performed until the complete oxide clear-out is achieved on the large gates (II), with full exposure of the sacrificial layer (18).

As described in FIG. 2c, during the etch back step, the within-wafer and within-die non-uniformity of the oxide layer (from CMP) implies that, in some locations, no sacrificial layer is etched away while in other locations a layer of a thickness y (with $y<t_{SiGe}$) is etched away. The sacrificial layer (18) does thus not act as a stop layer.

The sacrificial layer within-wafer and within-die non-uniformity, after the oxide clear-out of the gates, does not pose a problem, because all sacrificial material remaining on the wafers is then removed (by wet etch) very selectively to all other materials present in the wafers as shown in FIG. 2d. After removing the sacrificial layer, the silicidation (optionally a full silicidation) of the gates is then performed in gate electrodes with a controlled height (i.e. the deposited gate electrode thickness).

In a preferred embodiment the gate electrode is poly-silicon and the removal process is a selective wet etch.

By employing the sacrificial layer and the method as described above, an excellent control of the poly gate electrode and spacer height is achieved. As shown in FIG. 2d the initial thickness of the poly-silicon gate electrode ($t_{electrode}$) is kept all over the different gate lengths.

A sacrificial cap layer (for example in SiGe) can also be interesting for obtaining devices with higher spacers height as compared to the gate electrode height prior to the gate silicidation. This allows
- better control of the amount of metal (e.g. Ni) accessing the gate electrode prior to the (full) silicidation of the gate, hence leading to a better silicide phase control down to smaller gate lengths, and
- nicely containing the (fully) silicided gate inside the spacers after the volume expansion occurring during full silicidation of the gates. The volume expansion is even more severe for metal-rich silicides).

In a preferred embodiment the method for controlling the gate electrode height is used in the fabrication process of advanced CMOS devices with about 45 nm gate length. In the same preferred embodiment the poly-silicon gate electrode (13) has a thickness of about 100 nm and the SiGe sacrificial layer (18) a thickness of about 25 nm. The patterned gate stack is encapsulated with nitride spacers (15) and the material (17) used for planarization is phosphosilicate glass.

After CMP of the material (17) and dry-etch oxide etch back, a 90% over-etch step is performed. This over-etch step is only partially etching away the SiGe from the small gates, leaving enough on place to protect the underneath poly-Si gate electrode. After removing selectively the SiGe from the gate electrode, the gate silicidation process is started by depositing about 60 nm Ni, followed by a two-step rapid thermal process (RTP).

Figure 3:
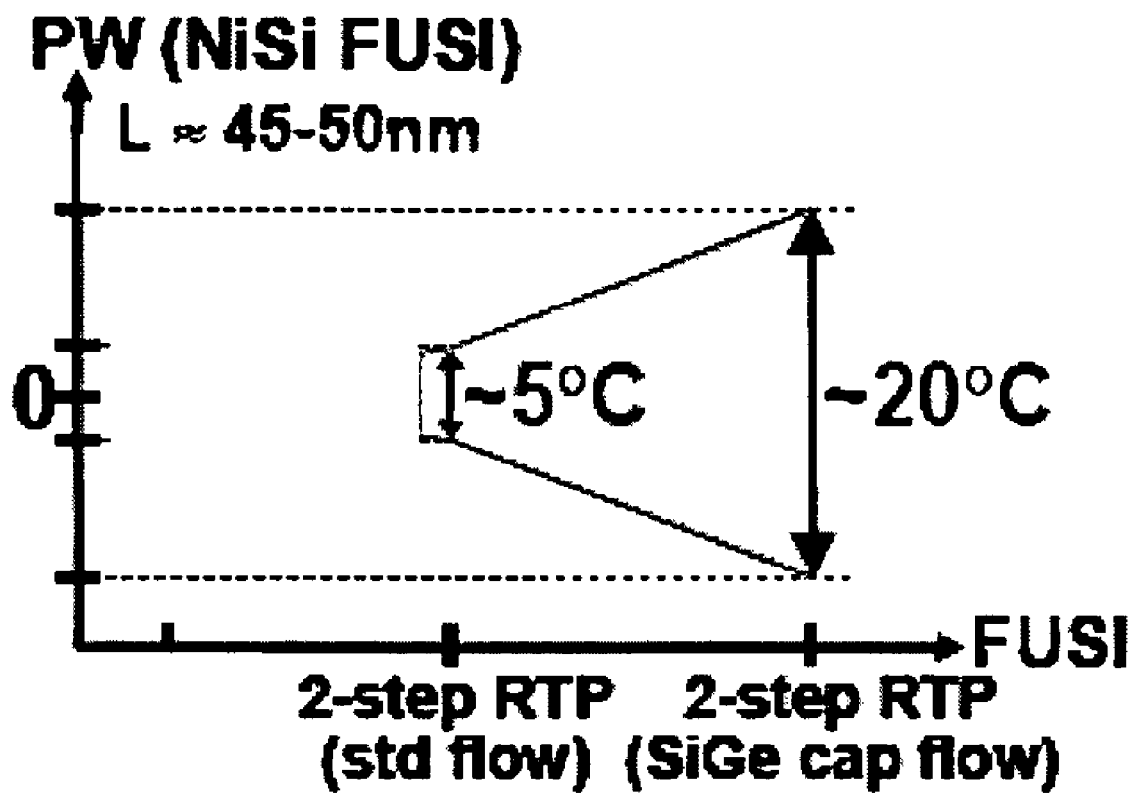
FIG. 3 represents the RTP1 temperature process window (PW) for NiSi_FUSI for 45 nm NMOS devices. PW is increased from about 5° C. with a standard 2-step RTP flow, to about 20° C. with the SiGe sacrificial cap layer flow. The latest corresponds to the method according to one embodiment.

The process window (PW) of the RTP1 step for NiSi FUSI gate formation has been expanded from about 5° C. in the conventional 2-step RTP flow, to about 20° C. with the SiGe sacrificial cap layer flow. FIG. 3 illustrates this process window expansion for about 45 nm NMOS devices.

The approach according to the embodiment offers many advantages. After the sacrificial layer removal, smaller and bigger devices with identical gate electrode height are obtained everywhere on the wafer. This is an essential factor to guarantee FUSI phase control down to small gate lengths. The process sensitivity to the inherent non-uniformity (within-die) of CMP is substantially reduced. Also, a smaller sensitivity to within-wafer CMP non-uniformity is thus obtained. As a consequence, a more relaxed CMP process can be used in the fabrication of FUSI CMOS devices. Linked with this, less tight constraints are required for the selectivity ratios in the dry etch process used to clear out the oxide from the gate electrodes. All these elements contribute in obtaining a more robust (enhanced manufacturability) process for FUSI integration.

The method according to the embodiment adds one extra process step to the process flow for the removal of the sacrificial cap layer. However, since the removal is highly selective, it is a simple, fast processing step.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of controlling the gate electrode height in a silicidation process, comprising:
   applying a sacrificial cap layer on top of each of at least one gate electrode, each of the at least one gate electrode deposited with a given height on a semiconductor substrate,
   applying an additional layer of oxide on top of the sacrificial layer,
   covering the semiconductor substrate with a material, the substrate having thereon the at least one gate electrode having the sacrificial cap layer and the additional layer,
   performing a chemical-mechanical polishing (CMP) planarization,
   removing at least the material and the additional layer of oxide until on top of each of the at least one gate electrode the sacrificial cap layer is exposed,
   removing the sacrificial cap layer from each of the at least one gate electrode, yielding each of the at least one gate electrode still having the given height.

2. The method of claim 1, further comprising patterning and encapsulating with spacers the gate electrode, the gate electrode having the sacrificial cap layer and the additional layer of oxide.

3. The method of claim 1, further comprising siliciding the at least one gate electrode still having the given height.

4. The method of claim 1, wherein the at least one gate electrode is formed in poly-silicon or in amorphous silicon.

5. The method of claim 1, wherein the sacrificial cap layer is formed in SiGe.

6. The method of claim 1, wherein the sacrificial cap layer is removed by a wet etching process.

7. The method of claim 1, wherein the material for covering the semiconductor substrate is oxide or phosphosilicate glass.

8. The method of claim 1, further comprising providing a semiconductor substrate comprising at least one gate electrode.

9. A method of controlling the gate electrode height in a silicidation process, comprising:
    applying a sacrificial SiGe cap layer on top of each of at least one gate electrode, each of the at least one gate electrode deposited with a given height on a semiconductor substrate;
    applying an additional layer of oxide on top of the sacrificial SiGe layer;
    covering with a material the semiconductor substrate, the substrate having thereon the at least one gate electrode having the sacrificial SiGe cap layer and the additional layer of oxide,
    performing a chemical-mechanical polishing (CMP) planarization,
    removing at least the material and the additional layer of oxide until on top of each of the at least one gate electrode the sacrificial SiGe cap layer is exposed,
    removing the sacrificial SiGe cap layer from each of the at least one gate electrode, yielding each of the at least one gate electrode still having the given height.

10. The method of claim 9, further comprising providing a semiconductor substrate comprising at least one gate electrode made of poly-silicon or amorphous silicon.

11. The method of claim 9, further comprising siliciding the at least one gate electrode still having the given height.

12. The method of claim 9, wherein the sacrificial SiGe cap layer is removed by a wet etching process.

13. The method of claim 9, wherein the material for covering the semiconductor substrate is oxide or phosphosilicate glass.

14. A method of controlling the gate electrode height in a silicidation process, comprising:
    applying a sacrificial cap layer on top of a first and second gate electrode, each of the first and second gate electrode deposited with a given height on a semiconductor substrate, the first gate electrode having a shorter length than the second gate electrode;
    applying an additional layer of oxide on top of the sacrificial layer on each of the first and second gate electrode;
    covering the semiconductor substrate with a material, the substrate having thereon the first and second gate electrode having the sacrificial cap layer and the additional layer;
    performing a chemical-mechanical polishing (CMP) planarization;
    removing at least the material and the additional layer of oxide until on top of each of the first and second gate electrode the sacrificial cap layer is exposed; and
    removing the sacrificial cap layer on each of the first and second gate electrode, yielding each of the first and second gate electrode still having the given height.

15. The method of claim 14, wherein the process of performing a CMP planarization is performed after the process of covering the semiconductor substrate with a material, and the process of removing the material and the additional layer of oxide is performed after the process of performing a CMP planarization, and the process of removing the sacrificial cap layer is performed after the process of removing the material and the additional layer of oxide.

16. The method of claim 14, wherein each of the first and second gate electrode has the material remaining thereon after the process of performing a CMP planarization.

17. The method of claim 14, wherein during the process of removing at least the material and the additional layer of oxide, the sacrificial cap layer on the first gate electrode is partially etched, and the process of removing the sacrificial cap layer comprises removing the remaining sacrificial cap layer on the first gate electrode and the sacrificial cap layer on the second gate electrode.

18. The method of claim 14, further comprising, prior to the process of covering the semiconductor substrate with a material, patterning and encapsulating with spacers each of the first and second gate electrode, each of the gate electrodes having the sacrificial cap layer and the additional layer of oxide.

19. The method of claim 18, wherein the process of removing the sacrificial cap layer comprises removing the sacrificial cap layer from the second gate electrode and the remaining sacrificial cap layer from the first gate electrode selectively towards the spacers, the gate electrode, and the material, therefore yielding each of the at least one gate electrode still having the given height.

20. The method of claim 18, wherein, after the process of patterning and encapsulating with spacers each of the first and second gate electrode, the semiconductor substrate has the first and second gate electrode, a first and second source region, and a first and second drain region, and the method further comprising, prior to the process of covering with a material, performing silicidation of the source and drain regions.

* * * * *